(12) United States Patent
Yoon

(10) Patent No.: US 11,935,934 B2
(45) Date of Patent: Mar. 19, 2024

(54) SEMICONDUCTOR DEVICE AND METHOD FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 271 days.

(21) Appl. No.: 17/502,737

(22) Filed: Oct. 15, 2021

(65) Prior Publication Data

US 2022/0352331 A1    Nov. 3, 2022

(30) Foreign Application Priority Data

May 3, 2021    (KR) .......................... 10-2021-0057421

(51) Int. Cl.
| | |
|---|---|
| *H01L 29/423* | (2006.01) |
| *H01L 21/02* | (2006.01) |
| *H01L 21/768* | (2006.01) |
| *H01L 29/40* | (2006.01) |
| *H01L 29/51* | (2006.01) |

(52) U.S. Cl.
CPC ........ *H01L 29/4236* (2013.01); *H01L 21/022* (2013.01); *H01L 21/76849* (2013.01); *H01L 21/7685* (2013.01); *H01L 29/401* (2013.01); *H01L 29/513* (2013.01)

(58) Field of Classification Search
CPC ........... H01L 29/66568; H01L 29/4232; H01L 29/66477; H01L 29/78391; H01L 29/4236; H01L 29/513; H01L 21/8234; H01L 21/022; H01L 21/76849; H01L 21/7685
See application file for complete search history.

(56) References Cited

U.S. PATENT DOCUMENTS

| | | | |
|---|---|---|---|
| 8,258,546 B2 | 9/2012 | Hung et al. | |
| 11,705,497 B2 * | 7/2023 | Lee | H01L 29/512 |
| | | | 257/401 |
| 2013/0105901 A1 * | 5/2013 | Park | H01L 21/324 |
| | | | 257/E27.06 |
| 2021/0242198 A1 * | 8/2021 | Toyoda | H01L 29/739 |
| 2022/0302116 A1 * | 9/2022 | Wang | H01L 29/66545 |

FOREIGN PATENT DOCUMENTS

CN         1220489 A  *  6/1999  ....... H01L 21/76264

* cited by examiner

*Primary Examiner* — Joseph C. Nicely
(74) *Attorney, Agent, or Firm* — IP & T GROUP LLP

(57) ABSTRACT

The present invention provides a semiconductor device including a capping layer of a reduced thickness and capable of preventing regrowth of an interface layer caused by oxygen injection, and a method for fabricating the same. According to an embodiment of the present invention, the semiconductor device comprises: an interface layer on a substrate; a high-k layer on the interface layer; a gate electrode on the high-k layer; and a capping layer including a first oxygen barrier layer and a second oxygen barrier layer on the gate electrode.

32 Claims, 7 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0057421, filed on May 3, 2021, which is herein incorporated by reference in its entirety.

BACKGROUND

1. Field

The present invention relates to a semiconductor device and a method for fabricating the same. More particularly, the present invention relates to a semiconductor device including an oxygen barrier layer for preventing oxidation of an interface layer and a method for fabricating the semiconductor device.

2. Description of the Related Art

As the semiconductor devices are more densely integrated, leakage current through the gate insulating layer of a transistor increases. To reduce leakage current, it has been proposed to use a gate insulating layer formed with a high-k dielectric material.

SUMMARY

An embodiment of the present invention provides a semiconductor device including a capping layer of a reduced thickness and capable of preventing regrowth of an interface layer caused by oxygen injection, and a method for fabricating the semiconductor device.

According to an embodiment of the present invention, a semiconductor device comprises: an interface layer on a substrate, a high-k layer on the interface layer, a gate electrode on the high-k layer, a capping layer including a first oxygen barrier layer, and a second oxygen barrier layer on the gate electrode.

According to another embodiment of the present invention, a semiconductor device comprises: a substrate including a first region and a second region; a buried gate structure formed in the substrate of the first region; an interface layer formed on the substrate of the second region; a high-k layer formed on the interface layer; a gate electrode on the high-k layer; and a capping layer including a first oxygen barrier layer and a second oxygen barrier layer over the gate electrode.

According yet to another embodiment of the present invention, a method for fabricating a semiconductor device comprises: forming an interface layer on a substrate; forming a high-k layer on the interface layer; forming a gate electrode on the high-k layer; and forming a capping layer including an alternating stack of a first oxygen barrier layer and a second oxygen barrier layer on the gate electrode.

The present invention has the effect of reducing parasitic capacitance by reducing the total thickness of a gate structure.

The present invention has the effect of preventing regrowth of an interface layer caused by a thermal process.

These and other features and advantages of the present invention will become better understood by the person having ordinary skill in the art of the present invention from the following figures and detailed description.

DETAILED DESCRIPTION

Figure 1:
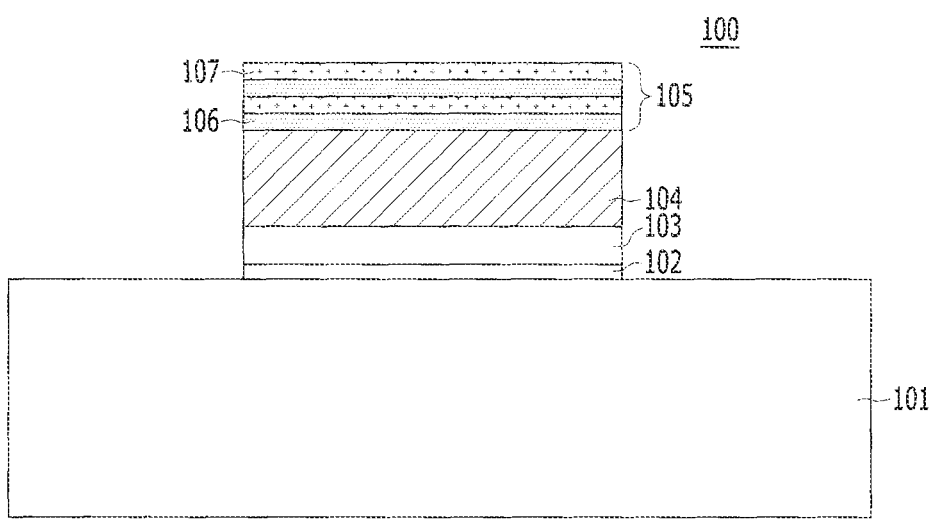
FIG. 1 is a diagram illustrating a semiconductor device according to an embodiment of the present invention.

Various embodiments described herein will be described with reference to cross-sectional views, plane views and block diagrams, which are schematic views of the present invention. Therefore, the structures of the drawings may be modified by fabricating technology and/or tolerances. The embodiments of the present invention are not limited to the specific structures shown in the drawings, but may include any changes in the structures that may be produced according to the fabricating process. Also, any regions and shapes of regions illustrated in the drawings having schematic views are intended to illustrate specific examples of structures of regions of the various elements, and are not intended to limit the scope of the invention.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

When a first element is referred to as being "over" a second element, it not only refers to a case where the first element is formed directly on the second element but also a case where a third element exists between the first element and the second element. When a first element is referred to as being "on" a second element, it refers to a case where the first element is formed directly on the second layer or the substrate.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

It is further noted, that in the various drawings, like reference numbers designate like elements.

FIG. 1 is a diagram illustrating a semiconductor device according to an embodiment of the present invention.

As shown in FIG. 1, the semiconductor device 100 may include a gate structure in which an interface layer 102, a high-k layer 103, a gate electrode 104, and a capping layer 105 are sequentially stacked on a substrate 101. The capping layer 105 may include an alternating stack of first oxygen barrier layers 106 and second oxygen barrier layers 107.

The substrate 101 may include a semiconductor substrate such as a silicon substrate. The substrate 101 may be made of a silicon-containing material. The substrate 101 may include various doping configurations depending on design requirements. The substrate 101 may include other semiconductors such as germanium, silicon carbide (SiC), silicon germanium (SiGe), or diamond. The substrate 101 may include a compound semiconductor and/or an alloy semiconductor. The substrate 101 may include a III-V group semiconductor substrate. The substrate 101 may include a compound semiconductor substrate such as GaAs, InAs, or InP. The substrate 101 may include a silicon on insulator (SOI) substrate. The substrate 101 may include a conductive region, for example, a well and a channel doped with an impurity, or a structure doped with an impurity.

The interface layer 102 may include silicon oxide, silicon oxynitride, or a combination thereof. The interface layer 102 may be formed by thermal oxidation or wet oxidation. The interface layer 102 may be formed to have a thickness smaller than that of the high-k layer 103.

The high-k layer 103 may have a higher dielectric constant than the interface layer 102. The high-k layer 103 may include a high-k material having a high dielectric constant. For example, the high-k layer 103 may include hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The gate electrode 104 may include a conductive material. The gate electrode 104 may include a metallic material. The gate electrode 104 may include a conductive metal material or a conductive metal nitride. The gate electrode 104 may include a conductive material such as W, TiN, TaN, WN, Re, Ir, Ru, Mo, Al, Cu, Co, Ni, a combination thereof, and/or other suitable compositions. In another embodiment, the gate electrode 104 may include a metal material for an N-type a fin field-effect transistor (FinFET) and/or a metal material for a P-type FinFET depending on the substrate 101.

The capping layer 105 may include a first oxygen barrier layer 106 and a second oxygen barrier layer 107. The capping layer 105 may include an alternating stack of the first oxygen barrier layers 106 and the second oxygen barrier layers 107. In another embodiment, the capping layer 105 may include a stack structure of the first oxygen barrier layer 106 and the second oxygen barrier layer 107. The capping layer 105 may include an alternating stack in which the first oxygen barrier layer 106 and the second oxygen barrier layer 107 are alternately stacked at least one or more times. The lowermost layer of the alternating stack may include the first oxygen barrier layer 106, and the uppermost layer of the alternating stack may include the second oxygen barrier layer 107.

The first oxygen barrier layer 106 and the second oxygen barrier layer 107 may include materials having different oxidation rates. The first oxygen barrier layer 106 and the second oxygen barrier layer 107 may include materials having different oxidation temperatures. For example, the first oxygen barrier layer 106 may include a silicon layer, and the second oxygen barrier layer 107 may include a germanium layer. In another embodiment, the first oxygen barrier layer 106 may include a germanium layer, and the second oxygen barrier layer 107 may include a silicon layer. In another embodiment, the first oxygen barrier layer 106 may include a first silicon germanium layer, and the second oxygen barrier layer 106 may include a second silicon germanium layer. The second silicon germanium layer may include different contents of silicon and germanium in the first silicon germanium layer. The first silicon germanium layer may have a chemical formula of $Si_xGe_y$ (where x and y are natural numbers). The second silicon germanium layer may have a chemical formula of $Si_zGe_w$ (where z and w are natural numbers, $z \neq x$, and $w \neq y$). For example, the first silicon germanium layer may have a higher silicon content and a lower germanium content than the second silicon germanium layer. In another embodiment, the first silicon germanium layer may have a lower silicon content and a higher germanium content than the second silicon germanium layer.

The thickness of the capping layer 105 may be smaller than the thickness of the gate electrode 104. The thickness of the capping layer 105 may be adjusted not to exceed 2 nm. The first oxygen barrier layer 106 and the second oxygen barrier layer 107 may have the same thickness. In another embodiment, the first oxygen barrier layer 106 and the second oxygen barrier layer 107 may have different thicknesses. Each of the first oxygen barrier layer 106 and the second oxygen barrier layer 107 may be formed to have an extremely thin thickness.

Both the first oxygen barrier layer 106 and the second oxygen barrier layer 107 may be formed in an amorphous form. The first oxygen barrier layer 106 and the second oxygen barrier layer 107 may maintain an amorphous form even in a high-temperature heat treatment process and may not be crystallized. Here, the high-temperature heat treatment process may refer to a heat treatment process (e.g., a post metal anneal (PMA) process) for improving the film quality of the high-k layer 103.

When oxygen is injected into the gate structure during the semiconductor process, the injected oxygen may induce the regrowth of the interface layer 102 by passing through the gate electrode 104 including a crystalline or low-density metal material and by reacting with the interface layer 102. Consequently, the regrowth of the interface layer 102 caused by the oxygen makes it difficult to maintain the inversion-layer thickness (Tinv) of the transistor to be thin. In order to form a capping layer only with a silicon layer for preventing oxygen injection (or penetration) into the gate structure, a very thick layer is required. As the gate length decreases as semiconductor devices are integrated, the capping layer is required to be thicker. However, if the capping layer is too thick, issues such as poor patterning during the patterning process for forming the gate structure may occur.

Therefore, in this embodiment, by applying the capping layer 105 which includes the first oxygen barrier layer 106 and the second oxygen barrier layer 107, oxygen injection (or penetration) into the gate structure may be prevented while maintaining a thickness that does not cause patterning issues. Accordingly, performance deterioration of the transistor may be prevented by preventing the regrowth of the interface layer 102 and the increase of the Tinv.

According to an embodiment of the present invention, since the capping layer 105 has as many interfaces as the number of the first oxygen barrier layers 106 and second oxygen barrier layers 107 stacked in the capping layer 105, it is possible to gather oxygen in stages along the interfaces. Also, since the temperatures at which oxidation of the first oxygen barrier layer 106 and the second oxygen barrier layer 107 occur are different from each other, oxygen at various temperatures can be gathered. As a result, the oxygen gathering range is widened.

In addition, a gathering effect of oxygen may increase because the first oxygen barrier layer 106 and the second oxygen barrier layer 107 have different oxidation rates. For example, silicon and oxygen have a different oxidation kinetics mechanism when the first oxygen barrier layer 106 is a silicon layer and the second oxygen barrier layer 107 is a germanium layer. The generation of germanium dioxide ($GeO_2$) is accelerated when germanium dioxide is formed by oxygen at an interface between the silicon layer and the germanium layer. Therefore, oxygen may not easily pass through a lower level even if a part of the capping layer 105 is oxidized by the oxygen injection (or penetration) because the oxidation occurs through a step-by-step process.

In addition, the capping layer 105 according to an embodiment of the present embodiment is effective at blocking the diffusion of oxygen through a grain boundary because each of the first oxygen barrier layer 106 and the second oxygen barrier layer 107 not only has an amorphous shape, but also maintains the amorphous shape even during a high temperature heat treatment.

In addition, the patterning process is easy as the total thickness of the capping layer 105 decreases. The parasitic capacitance decreases as the total thickness of the gate structure decreases. Thus, the device performance may be improved through enhanced speed characteristics.

Figure 2:
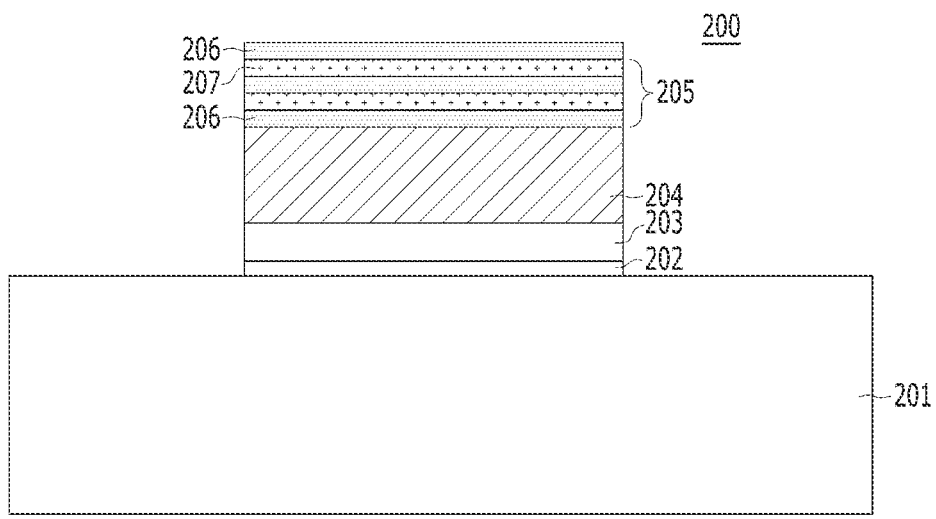
FIGS. 2 and 3 are diagrams illustrating semiconductor devices according to other embodiments of the present invention.
Figure 3:
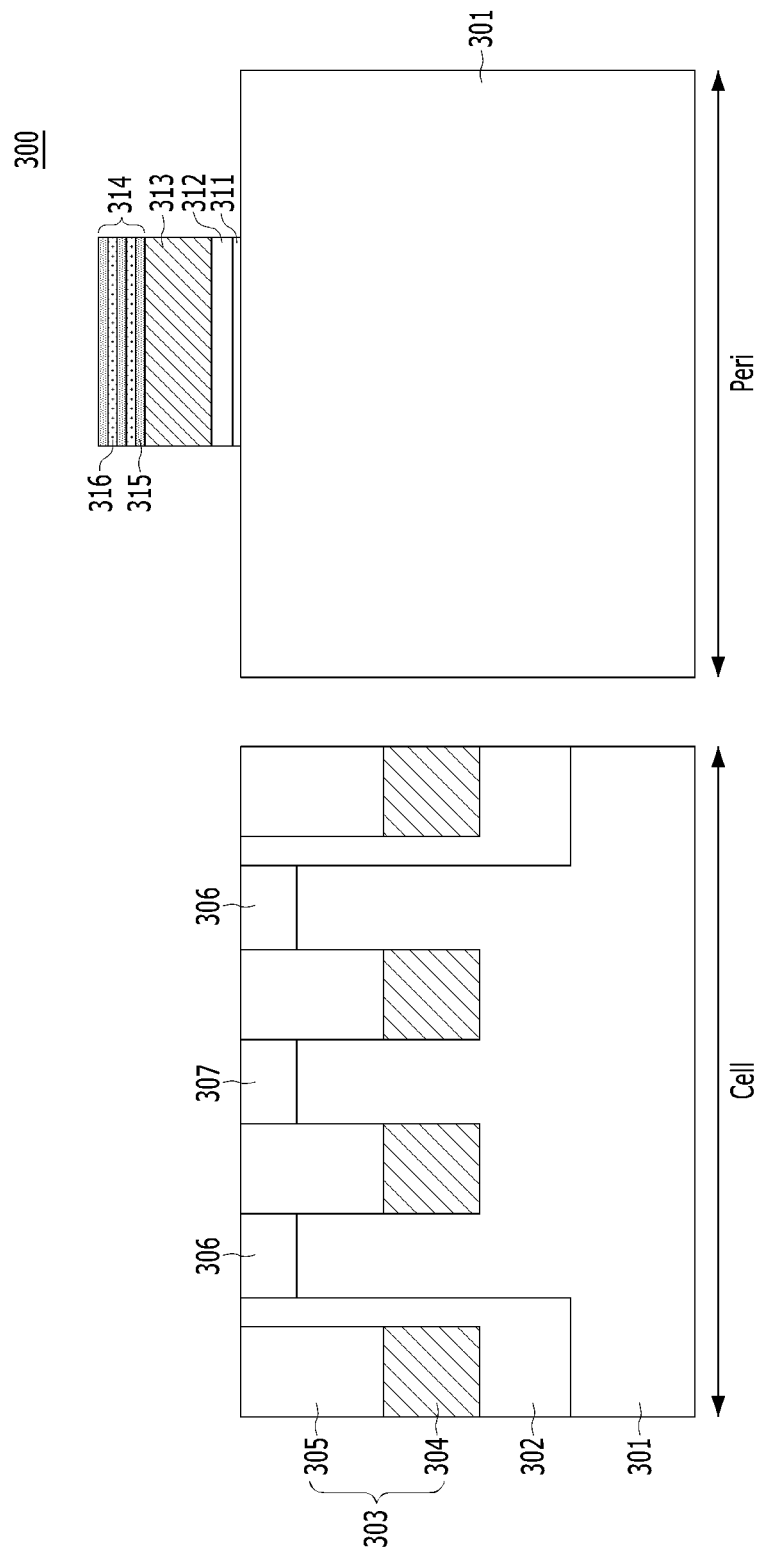

FIGS. 2 and 3 are diagrams illustrating semiconductor devices according to other embodiments of the present invention.

As shown in FIG. 2, a semiconductor device 200 may include a gate structure on a substrate 201. The gate structure may include an interface layer 202, a high-k layer 203, a gate electrode 204, and a capping layer 205 which are sequentially stacked in the recited order. The capping layer 205 may include an alternating stack of the first oxygen barrier layers 206 and the second oxygen barrier layers 207.

The substrate 201 may include a semiconductor substrate such as a silicon substrate. The substrate 201 may be made of a silicon-containing material. The substrate 201 may include various doping configurations depending on design requirements. The substrate 201 may include other semiconductors such as germanium, silicon carbide (SiC), silicon germanium (SiGe), or diamond. The substrate 201 may include a compound semiconductor and/or an alloy semiconductor. The substrate 201 may include a III-V group semiconductor substrate. The substrate 201 may include a compound semiconductor substrate such as GaAs, InAs, or InP. The substrate 201 may include a silicon on insulator (SOI) substrate. The substrate 201 may include a conductive region, for example, a well and a channel doped with an impurity, or a structure doped with an impurity.

The interface layer 202 may include silicon oxide, silicon oxynitride, or a combination thereof. The interface layer 202 may be formed by thermal oxidation or wet oxidation. The interface layer 202 may be formed to be thinner than the high-k layer 203.

The high-k layer 203 may have a higher dielectric constant than the interface layer 202. The high-k layer 203 may include a high-k material having a high dielectric constant. For example, the high-k layer 203 may include hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The gate electrode 204 may include a conductive material. The gate electrode 204 may include a metallic material. The gate electrode 204 may include a conductive metal material or a conductive metal nitride. The gate electrode 204 may include a conductive material such as tungsten (W), titanium nitride (TiN), tantalum nitride (TaN), tungsten nitride (WN), Rhenium (Re), iridium (Ir), ruthenium (Ru), Molybdenum (Mo), Aluminum (Al), copper (Cu), cobalt (Co), nickel (Ni), a combination thereof, and/or other suitable compositions. In another embodiment, the gate electrode 204 may include a metal material for an N-type FinFET and/or a metal material for a P-type FinFET depending on the substrate 201.

The capping layer 205 may include a first oxygen barrier layer 206 and a second oxygen barrier layer 207. The capping layer 205 may include an alternating stack of the first oxygen barrier layers 206 and the second oxygen barrier layers 207. In another embodiment, the capping layer 205 may include a stack structure of the first oxygen barrier layer 206 and the second oxygen barrier layer 207. The capping layer 205 may include an alternating stack in which the first oxygen barrier layer 206 and the second oxygen barrier layer 207 are alternately stacked at least one or more times. The lowermost and uppermost layers of the alternating stack may include the first oxygen barrier layer 206.

The first oxygen barrier layer 206 and the second oxygen barrier layer 207 may include materials having different oxidation rates. The first oxygen barrier layer 206 and the second oxygen barrier layer 207 may include materials having different oxidation temperatures. For example, the first oxygen barrier layer 206 may include a silicon layer, and the second oxygen barrier layer 207 may include a germanium layer. In another embodiment, the first oxygen barrier layer 206 may include a germanium layer, and the second oxygen barrier layer 207 may include a silicon layer. In another embodiment, the first oxygen barrier layer 206 may include a first silicon germanium layer, and the second oxygen barrier layer 206 may include a second silicon germanium layer. The second silicon germanium layer may include different contents of silicon and germanium in the first silicon germanium layer. The first silicon germanium layer may have a chemical formula of $Si_xGe_Y$ (where x and y are natural numbers). The second silicon germanium layer may have a chemical formula of $Si_zGe_w$ (where z and w are natural numbers, $z \neq x$, and $w \neq y$). For example, the first silicon germanium layer may have a higher silicon content and a lower germanium content than the second silicon germanium layer. In another embodiment, the first silicon germanium layer may have a lower silicon content and a higher germanium content than the second silicon germanium layer. The thickness of the capping layer 205 may be smaller than the thickness of the gate electrode 204. The thickness of the capping layer 205 may be adjusted not to exceed 2 nm. The first oxygen barrier layer 206 and the second oxygen barrier layer 207 may have the same thickness. In another embodiment, the first oxygen barrier layer 206 and the second oxygen barrier layer 207 may have different thicknesses. Each of the first oxygen barrier layer 206 and the second oxygen barrier layer 207 may be formed to have an extremely thin thickness.

Both the first oxygen barrier layer 206 and the second oxygen barrier layer 207 may be formed in an amorphous form. The first oxygen barrier layer 206 and the second oxygen barrier layer 207 may maintain an amorphous form and may not be crystallized even in a high-temperature heat treatment process. Here, the high-temperature heat treatment process may refer to a heat treatment process (e.g., a post metal anneal (PMA) process) for improving the film quality of the high-k layer 203.

As shown in FIG. 3, the semiconductor device 300 may include substrate 301 including a cell region Cell and a peripheral region Peri. The substrate 301 of the peripheral region Peri may include a gate structure in which an interface layer 311, a high-k layer 312, a gate electrode 313, and a capping layer 314 are sequentially stacked in the recited order. The capping layer 314 may include an alternating stack of first oxygen barrier layers 315 and second oxygen barrier layers 316.

The substrate 301 may include a semiconductor substrate such as a silicon substrate. The substrate 301 may be made of a silicon-containing material. The substrate 301 may include various doping configurations depending on design requirements. The substrate 301 may include other semiconductors such as germanium, silicon carbide (SiC), silicon germanium (SiGe), or diamond. The substrate 301 may include a compound semiconductor and/or an alloy semiconductor. The substrate 301 may include a III-V group semiconductor substrate. The substrate 301 may include a compound semiconductor substrate such as GaAs, InAs, or InP. The substrate 301 may include a silicon on insulator (SOI) substrate. The substrate 301 may include a conductive region, for example, a well and a channel doped with an impurity, or a structure doped with an impurity.

The cell region Cell of the substrate 301 may include an active region defined by a device separation layer 302 and another device separation layer 302. A buried gate structure 303 may be formed in the cell region Cell of the substrate 301. The buried gate structure 303 may include a buried gate electrode 304 and a buried gate capping layer 305. Source/drain regions 306 and 307 may be formed in the substrate 301 on both sides of the buried gate structure 303.

A gate structure may be formed on the peripheral region Peri of the substrate 301. The gate structure may include the interface layer 311, the high-k layer 312, the gate electrode 313, and the capping layer 314 which are sequentially stacked in the recited order.

The interface layer 311 may include silicon oxide, silicon oxynitride, or a combination thereof. The interface layer 311 may be formed by thermal oxidation or wet oxidation. The interface layer 311 may be formed to be thinner than the high-k layer 312.

The high-k layer 312 may have a higher dielectric constant than the interface layer 311. The high-k layer 312 may include a high-k material having a high dielectric constant. For example, the high-k layer 312 may include hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The gate electrode 313 may include a conductive material. The gate electrode 313 may include a metal material. The gate electrode 313 may include a conductive metal material or a conductive metal nitride. The gate electrode 313 may include a conductive material such as W, TiN, TaN, WN, Re, Ir, Ru, Mo, Al, Cu, Co, Ni, a combination thereof, and/or other suitable compositions. In another embodiment, the gate electrode 313 may include a metal material for an N-type FinFET and/or a metal material for a P-type FinFET depending on the substrate 301.

The capping layer 314 may include a first oxygen barrier layer 315 and a second oxygen barrier layer 316. The capping layer 314 may include an alternating stack of the first oxygen barrier layers 315 and the second oxygen barrier layers 316. In another embodiment, the capping layer 314 may include a stack structure of the first oxygen barrier layer 315 and the second oxygen barrier layer 316. The capping layer 314 may include an alternating stack in which the first oxygen barrier layer 315 and the second oxygen barrier layer 316 are alternately stacked at least one or more times. The lowermost layer of the alternating stack may include the first oxygen barrier layer 315, and the uppermost layer of the alternating stack may include the second oxygen barrier layer 316. In another embodiment, the capping layer 314 may include the first oxygen barrier layers 315 at the lowermost and uppermost layers of the alternating stack as shown in FIG. 2.

The first oxygen barrier layer 315 and the second oxygen barrier layer 316 may include materials having different oxidation rates. The first oxygen barrier layer 315 and the second oxygen barrier layer 316 may include materials having different oxidation temperatures. For example, the first oxygen barrier layer 315 may include a silicon layer, and the second oxygen barrier layer 316 may include a germanium layer. In another embodiment, the first oxygen barrier layer 315 may include a germanium layer, and the second oxygen barrier layer 316 may include a silicon layer. In another embodiment, the first oxygen barrier layer 315 may include a first silicon germanium layer, and the second oxygen barrier layer 316 may include a second silicon germanium layer. The second silicon germanium layer may include different amounts of silicon and germanium in the first silicon germanium layer. The first silicon germanium layer may have a chemical formula of $Si_xGe_Y$ (where x and y are natural numbers). The second silicon germanium layer may have a chemical formula of $Si_zGe_w$ (where z and w are natural numbers, z≠x, and w≠y). For example, the first silicon germanium layer may have a higher silicon content and a lower germanium content than the second silicon germanium layer. In another embodiment, the first silicon germanium layer may have a lower silicon content and a higher germanium content than the second silicon germanium layer.

The capping layer 314 may be thinner than the gate electrode 313. The thickness of the capping layer 314 may be adjusted not to exceed 2 nm. The first oxygen barrier layer 315 and the second oxygen barrier layer 316 may have the same thickness. In another embodiment, the first oxygen barrier layer 315 and the second oxygen barrier layer 316 may have different thicknesses. Each of the first oxygen barrier layer 315 and the second oxygen barrier layer 316 may be formed to have an extremely thin thickness.

Both the first oxygen barrier layer 315 and the second oxygen barrier layer 316 may be formed in an amorphous form. The first oxygen barrier layer 315 and the second oxygen barrier layer 316 may maintain an amorphous form and may not be crystallized even in a high-temperature heat treatment process. Here, the high-temperature heat treatment process may refer to a heat treatment process (e.g., a post metal anneal (PMA) process) for improving the film quality of the high-k layer 312.

FIGS. 4A to 4D are diagrams illustrating a method for fabricating a semiconductor device according to an embodiment of the present invention. FIGS. 4A to 4D illustrate a method for fabricating the semiconductor device illustrated in FIG. 1. The method may also be applied to the methods for fabricating the semiconductor devices of FIGS. 2 and 3.

Figure 4A:
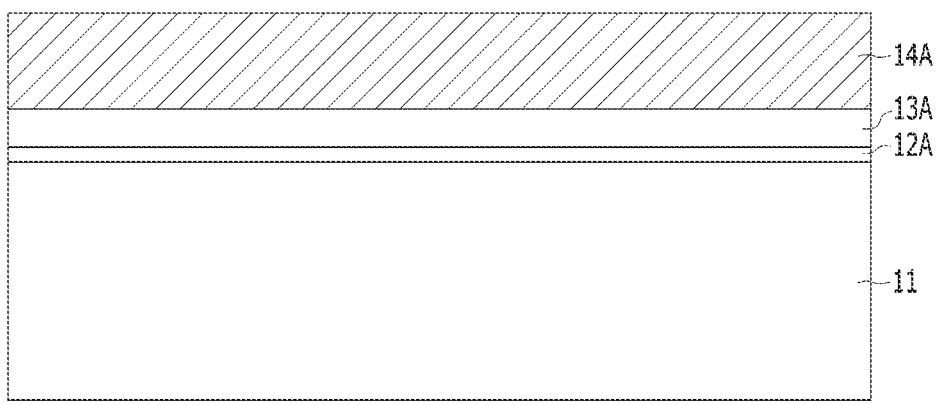
FIGS. 4A to 4D are diagrams illustrating a method for fabricating a semiconductor device according to an embodiment of the present invention.

As shown in FIG. 4A, an interface material layer 12A, a high-k material layer 13A, and an electrode material layer 14A may be sequentially formed on a substrate 11 in the recited order.

The substrate 11 may include a semiconductor substrate such as a silicon substrate. The substrate 11 may be made of a silicon-containing material. The substrate 11 may include various doping configurations depending on the design requirements. The substrate 11 may include other semiconductors such as germanium, silicon carbide (SiC), silicon germanium (SiGe), or diamond. The substrate 11 may include a compound semiconductor and/or an alloy semiconductor. The substrate 11 may include a III-V group semiconductor substrate. The substrate 11 may include a compound semiconductor substrate such as GaAs, InAs, or InP. The substrate 11 may include a silicon on insulator (SOI) substrate. The substrate 11 may include a conductive region, for example, a well and a channel doped with an impurity, or a structure doped with an impurity.

The interface material layer 12A may include silicon oxide or silicon oxynitride, or a combination thereof. The interface material layer 12A may be formed by thermal oxidation or wet oxidation. The interface material layer 12A may be formed to be thinner than the high-k material layer 13A.

The high-k material layer 13A may have a higher dielectric constant than the interface material layer 12A. The high-k material layer 13A may include a high-k material having a high dielectric constant. For example, the high-k material layer 13A may include hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The electrode material layer 14A may include a conductive material. The electrode material layer 14A may include a metal material. The electrode material layer 14A may include a conductive metal material or a conductive metal nitride. The electrode material layer 14A may include a conductive material such as W, TiN, TaN, WN, Re, Ir, Ru, Mo, Al, Cu, Co, Ni, a combination thereof, and/or other suitable compositions. In another embodiment, the electrode material layer 14A may include a metal material for an N-type FinFET and/or a metal material for a P-type FinFET depending on the substrate 11.

Figure 4B:
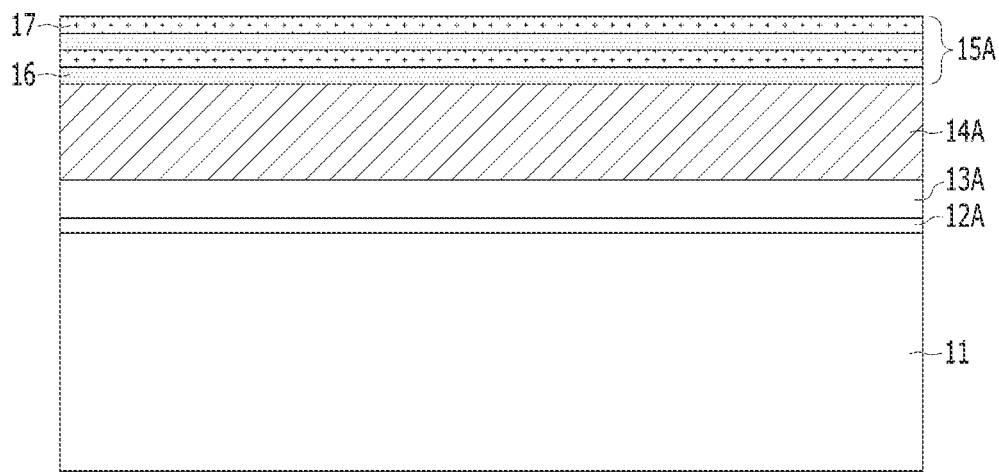

As shown in FIG. 4B, a capping material layer 15A including an alternating stack of the first oxygen barrier layers 16 and the second oxygen barrier layers 17 may be formed. In another embodiment, the capping material layer 15A may include a stack structure of the first oxygen barrier layer 16 and the second oxygen barrier layer 17. The capping material layer 15A may include an alternating stack in which the first oxygen barrier layer 16 and the second oxygen barrier layer 17 are alternately stacked at least one or more times. The lowermost layer of the alternating stack may include the first oxygen barrier layer 16, and the uppermost layer of the alternating stack may include the second oxygen barrier layer 17. In another embodiment, the alternating stack may include the first oxygen barrier layer 16 at the lowermost and uppermost layers of the alternating stack as shown in FIG. 2.

The first oxygen barrier layer 16 and the second oxygen barrier layer 17 may include materials having different oxidation rates. The first oxygen barrier layer 16 and the second oxygen barrier layer 17 may include materials having different oxidation temperatures. For example, the first oxygen barrier layer 16 may include a silicon layer, and the second oxygen barrier layer 17 may include a germanium layer. In another embodiment, the first oxygen barrier layer 16 may include a germanium layer, and the second oxygen barrier layer 17 may include a silicon layer. In another embodiment, the first oxygen barrier layer 16 may include a first silicon germanium layer, and the second oxygen barrier layer 16 may include a second silicon germanium layer. The second silicon germanium layer may include different contents of silicon and germanium in the first silicon germanium layer. The first silicon germanium layer may have a chemical formula of $Si_xGe_Y$ (where x and y are natural numbers). The second silicon germanium layer may have a chemical formula of $Si_zGe_w$ (where z and w are natural numbers, z≠x, and w≠y). For example, the first silicon germanium layer may have a higher silicon content and a lower germanium content than the second silicon germanium layer. In another embodiment, the first silicon germanium layer may have a lower silicon content and a higher germanium content than the second silicon germanium layer.

The thickness of the capping material layer 15A may be smaller than that of the electrode material layer 14A. The thickness of the capping material layer 15A may be adjusted not to exceed 2 nm. The first oxygen barrier layer 16 and the second oxygen barrier layer 17 may be formed to have the same thickness. In another embodiment, the first oxygen barrier layer 16 and the second oxygen barrier layer 17 may be formed to have different thicknesses. Each of the first oxygen barrier layer 16 and the second oxygen barrier layer 17 may be formed to have an extremely thin thickness.

Both the first oxygen barrier layer 16 and the second oxygen barrier layer 17 may be formed in an amorphous form. The first oxygen barrier layer 16 and the second oxygen barrier layer 17 may maintain an amorphous form and may not be crystallized even in a high-temperature heat treatment process. Here, the high-temperature heat treatment process may refer to a heat treatment process (e.g., a post metal anneal (PMA) process) for improving the film quality of a high-k layer 13.

The capping material layer 15A may be formed by a sputtering process, but is not limited thereto. The sputtering process may be formed by one of a dual target, a dual material target, or a dual material/dual target. The dual target may apply two targets as sputtering targets, and may include a silicon material and a germanium material. The dual material target may apply a single target as a sputtering target, but the single target may include both silicon and germanium. The dual material/dual target may include both silicon and germanium, and may include two targets having different composition ratios of silicon and germanium included in each target, that is, two silicon germanium materials having different composition ratios.

The sputtering process may change power, pressure, and deposition thickness as necessary. The capping material layer 15A may be adjusted to have a thickness capable of preventing the oxygen injection during the heat treatment process.

In another embodiment, the capping material layer 15A may also be formed by a physical vapor deposition (PVD), chemical vapor deposition (CVD), and atomic layer deposition (ALD) process for high aspect ratio.

Figure 4C:
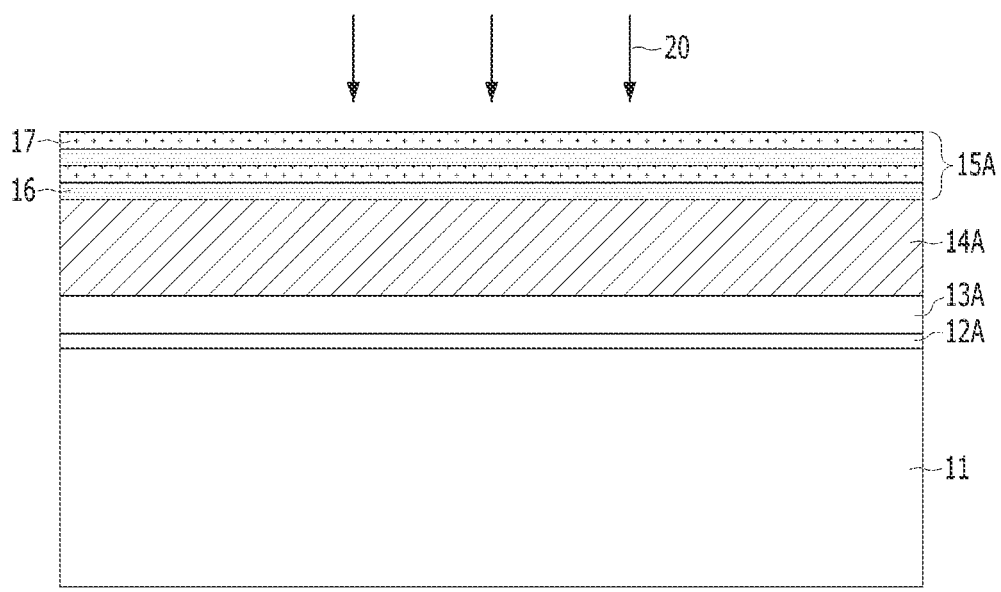

As shown in FIG. 4C, a heat treatment 20 for improving the film quality of the high-k material layer 13A may be performed. During the heat treatment 20, the first oxygen barrier layer 16 and the second oxygen barrier layer 17 may maintain an amorphous form and may not be crystallized even in a high-temperature heat treatment process. Depending on the atmosphere during the heat treatment 20, oxygen diffusion or oxygen injection (or penetration) may begin. However, re-oxidation of the interface material layer 12A may be prevented because the oxygen injection (or penetration) into the interface material layer 12A is prevented by the capping material layer 15A including the first and second oxygen barrier layers 16 and 17. Therefore, the reliability of the semiconductor device may be secured because the extremely thin thickness of Tinv can be maintained without being changed.

Subsequently, a part of the capping material layer 15A, that is, some layers of the alternating stack may be removed, but is not limited thereto. The remaining capping material layer 15A may include a minimum thickness capable of protecting the electrode material layer 14A in a subsequent process.

Figure 4D:
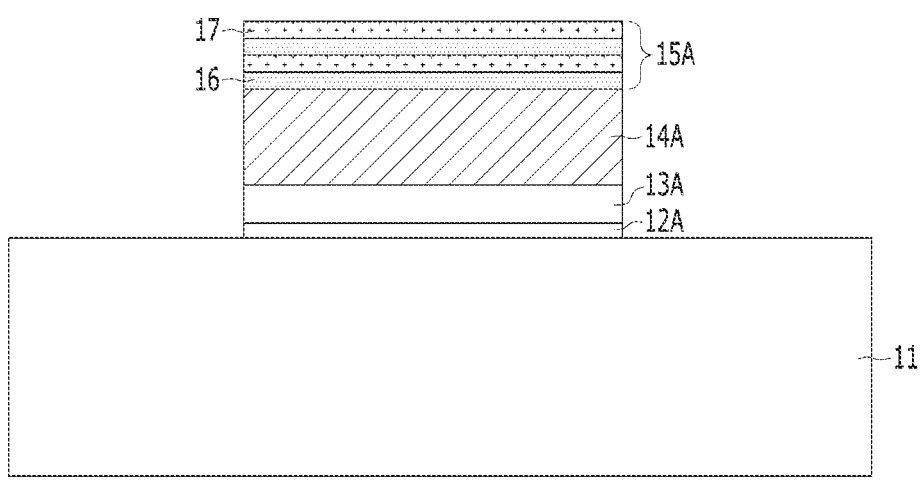

As shown in FIG. 4D, a patterning process may be performed. In the patterning process, a mask pattern (not shown) may be formed on the capping material layer 15A (refer to FIG. 4C), and a subsequent etching process may be performed using the mask pattern (not shown) as an etching mask.

Accordingly, a gate structure in which an interface layer 12, a high-k layer 13, a gate electrode 14, and a capping layer 15 are sequentially stacked may be formed from the substrate 11.

The above-described invention is not limited by the above-described embodiments and the accompanying drawings. It will readily be appreciated by one of ordinary skill in the art that various substitutions, changes, or modifications may be made thereto without departing from the scope of the disclosure.

What is claimed is:

1. A semiconductor device, comprising:
    an interface layer on a substrate;
    a high-k layer on the interface layer;
    a gate electrode on the high-k layer; and
    a capping layer including a first oxygen barrier layer and a second oxygen barrier layer on the gate electrode, wherein the capping layer includes an alternating stack of the first oxygen barrier layers and the second oxygen barrier layers.

2. The semiconductor device of claim 1, wherein a lowermost layer of the alternating stack is the first oxygen barrier layer and an uppermost layer of the alternating stack is the second oxygen barrier layer.

3. The semiconductor device of claim 1, wherein a lowermost layer and an uppermost layer of the alternating stack are the first oxygen barrier layer.

4. The semiconductor device of claim 1, wherein the first and second oxygen barrier layers have different oxidation rates.

5. The semiconductor device of claim 1, wherein the first and second oxygen barrier layers have different oxidation temperatures.

6. The semiconductor device of claim 1, wherein the first oxygen barrier layer is a silicon layer, and the second oxygen barrier layer is a germanium layer.

7. The semiconductor device of claim 1, wherein the first oxygen barrier layer is a germanium layer, and the second oxygen barrier layer is a silicon layer.

8. The semiconductor device of claim 1, wherein
    the first oxygen barrier layer is a first silicon germanium layer, and
    the second oxygen barrier layer is a second silicon germanium layer having different contents of silicon and germanium in the first silicon germanium layer.

9. The semiconductor device of claim 1, wherein the first oxygen barrier layer and the second oxygen barrier layer are amorphous materials.

10. The semiconductor device of claim 1, wherein the capping layer is thinner than the gate electrode.

11. The semiconductor device of claim 1, wherein the interface layer includes silicon oxide or silicon oxynitride.

12. A semiconductor device, comprising:
    a substrate including a first region and a second region;
    a buried gate structure formed in the substrate of the first region;
    an interface layer formed on the substrate of the second region;
    a high-k layer formed on the interface layer;
    a gate electrode on the high-k layer; and
    a capping layer including a first oxygen barrier layer and a second oxygen barrier layer on the gate electrode, wherein the capping layer includes an alternating stack of the first oxygen barrier layers and the second oxygen barrier layers.

13. The semiconductor device of claim 12, wherein
    a lowermost layer of the alternating stack is the first oxygen barrier layer, and
    an uppermost layer of the alternating stack is the second oxygen barrier layer.

14. The semiconductor device of claim 12, wherein
    a lowermost layer and an uppermost layer of the alternating stack are the first oxygen barrier layer.

15. The semiconductor device of claim 12, wherein the first oxygen barrier layer and the second oxygen barrier layer have different oxidation rates.

16. The semiconductor device of claim 12, wherein the first oxygen barrier layer and the second oxygen barrier layer have different oxidation temperatures.

17. The semiconductor device of claim 12, wherein the first oxygen barrier layer is a silicon layer, and the second oxygen barrier layer is a germanium layer.

18. The semiconductor device of claim 12, wherein the first oxygen barrier layer is a germanium layer, and the second oxygen barrier layer is a silicon layer.

19. The semiconductor device of claim 12, wherein
the first oxygen barrier layer is a first silicon germanium layer, and
the second oxygen barrier layer is a second silicon germanium layer having different contents of silicon and germanium in the first silicon germanium layer.

20. The semiconductor device of claim 12, wherein the first oxygen barrier layer and the second oxygen barrier layer are amorphous materials.

21. The semiconductor device of claim 12, wherein the capping layer is thinner than the gate electrode.

22. The semiconductor device of claim 12, wherein the interface layer includes silicon oxide or silicon oxynitride.

23. A method for fabricating a semiconductor device, the method comprising:
forming an interface layer on a substrate;
forming a high-k layer on the interface layer;
forming a gate electrode on the high-k layer; and
forming a capping layer including an alternating stack of first oxygen barrier layers and second oxygen barrier layers on the gate electrode.

24. The method of claim 23, after the forming of the capping layer, further including performing an anneal process for improving a film quality of the high-k layer.

25. The method of claim 23, wherein the first oxygen barrier layer is a silicon layer, and the second oxygen barrier layer is a germanium layer.

26. The method of claim 23, wherein the first oxygen barrier layer is a germanium layer, and the second oxygen barrier layer is a silicon layer.

27. The method of claim 23, wherein
the first oxygen barrier layer is a first silicon germanium layer, and
the second oxygen barrier layer is a second silicon germanium layer having different contents of silicon and germanium in the first silicon germanium layer.

28. The method of claim 23, wherein the forming of the capping layer includes performing a sputtering process.

29. The method of claim 28, wherein the sputtering process is performed using a dual target that applies a silicon material and germanium material as sputtering targets, respectively.

30. The method of claim 28, wherein the sputtering process is performed using a dual material target that applies a silicon germanium material as a sputtering target.

31. The method of claim 28, wherein the sputtering process is performed using a dual material/dual target that applies two silicon germanium materials of different composition ratios as sputtering targets, respectively.

32. The method of claim 24, after the performing of the anneal process, further including removing some layers of the alternating stack.

* * * * *